(12) United States Patent
Liu et al.

(10) Patent No.: US 8,275,137 B1
(45) Date of Patent: Sep. 25, 2012

(54) AUDIO DISTORTION CORRECTION FOR A PARAMETRIC REPRODUCTION SYSTEM

(75) Inventors: Wensen Liu, San Diego, CA (US); Norbert P. Daberko, Encinitas, CA (US); James J. Croft, III, San Diego, CA (US)

(73) Assignee: Parametric Sound Corporation, Poway, CA (US)

( * ) Notice: Subject to any disclaimer, the term of this patent is extended or adjusted under 35 U.S.C. 154(b) by 1189 days.

(21) Appl. No.: 12/079,204

(22) Filed: Mar. 24, 2008

Related U.S. Application Data

(60) Provisional application No. 60/919,838, filed on Mar. 22, 2007.

(51) Int. Cl.
H03G 3/00 (2006.01)

(52) U.S. Cl. ............................ 381/61; 381/94.1

(58) Field of Classification Search .............. 381/61, 381/77–79, 97, 98, 55–59, 116, 117, 103, 381/111, 94.1–94.4, 102, 106, 75; 367/118, 367/137, 138

See application file for complete search history.

(56) References Cited

U.S. PATENT DOCUMENTS

| | | | |
|---|---|---|---|
| 1,643,791 A | 4/1924 | Slepian | |
| 1,616,639 A | 2/1927 | Sprague | |
| 1,764,008 A | 6/1930 | Crozier | |
| 1,799,053 A | 3/1931 | Mache | |
| 1,809,754 A | 6/1931 | Steedle | |
| 1,951,669 A | 3/1934 | Ramsey | |
| 1,983,377 A | 12/1934 | Kellogg | |
| 2,461,344 A | 2/1949 | Olson | |
| 2,855,467 A | 10/1958 | Curry | |
| 2,872,532 A | 2/1959 | Buchmann et al. | |
| 2,935,575 A | 5/1960 | Bobb | |
| 2,975,243 A | 3/1961 | Katella | |
| 2,975,307 A | 3/1961 | Schroeder et al. | |
| 3,008,013 A | 11/1961 | Williamson et al. | |
| 3,012,107 A | 12/1961 | Hanlet | |
| 3,012,222 A | 12/1961 | Hagemann | |

(Continued)

FOREIGN PATENT DOCUMENTS

EP 0 599 250 6/1994

(Continued)

OTHER PUBLICATIONS

Kite et al. "Parametric Array in Air: Distortion Reduction by Preprocessing," Applied Research Laboratories, University of Texas, 11 pages., 1997.*

(Continued)

*Primary Examiner* — Xu Mei
*Assistant Examiner* — Lun-See Lao
(74) *Attorney, Agent, or Firm* — Thorpe North & Western LLP

(57) ABSTRACT

A system and methods for distortion reduction in a non-linear audio system are disclosed. A method includes the operation of defining a non-linear system transfer function which relates a system electronic input signal with a system acoustic output over a range in which the system acoustic output is in a transition between non-saturated and saturated conditions in a medium in which the system acoustic output of the non-linear audio system is broadcast. A preprocessing transfer function is created that is the inverse of the non-linear system transfer function. The preprocessing transfer function is applied to the system electronic input signal to reduce the level of harmonic distortion at the system acoustic output.

8 Claims, 9 Drawing Sheets

U.S. PATENT DOCUMENTS

| | | |
|---|---|---|
| 3,136,867 A | 6/1964 | Brettell |
| 3,345,469 A | 10/1967 | Rod |
| 3,373,251 A | 3/1968 | Seeler |
| 3,389,226 A | 6/1968 | Peabody |
| 3,398,810 A | 8/1968 | Clark, III |
| 3,461,421 A | 8/1969 | Stover |
| 3,544,733 A | 12/1970 | Reylek |
| 3,612,211 A | 10/1971 | Clark, III |
| 3,613,069 A | 10/1971 | Cary, Jr. |
| 3,641,421 A | 2/1972 | Graf et al. |
| 3,654,403 A | 4/1972 | Bobb |
| 3,674,946 A | 7/1972 | Winey |
| 3,710,332 A | 1/1973 | Tischner et al. |
| 3,723,957 A | 3/1973 | Damon |
| 3,742,433 A | 6/1973 | Kay et al. |
| 3,787,642 A | 1/1974 | Young, Jr. |
| 3,821,490 A | 6/1974 | Bobb |
| 2,825,834 A | 7/1974 | Stuart et al. |
| 3,825,834 A | 7/1974 | Stuart et al. |
| 3,829,623 A | 8/1974 | Willis et al. |
| 3,833,771 A | 9/1974 | Collinson |
| 3,836,951 A | 9/1974 | Geren et al. |
| 3,892,927 A | 7/1975 | Lindenberg |
| 3,908,098 A | 9/1975 | Kawakami et al. |
| 3,919,499 A | 11/1975 | Winey |
| 3,941,946 A | 3/1976 | Kawakami et al. |
| 3,961,291 A | 6/1976 | Whitehouse et al. |
| 3,997,739 A | 12/1976 | Kishikawa et al. |
| 4,005,278 A | 1/1977 | Gorike |
| 4,015,089 A | 3/1977 | Ishii et al. |
| 4,056,742 A | 11/1977 | Tibbetts |
| 4,064,375 A | 12/1977 | Russell et al. |
| 4,149,031 A | 4/1979 | Cooper |
| 4,160,882 A | 7/1979 | Driver |
| 4,166,197 A | 8/1979 | Moog et al. |
| 4,207,571 A | 6/1980 | Passey |
| 4,210,786 A | 7/1980 | Winey |
| 4,242,541 A | 12/1980 | Ando |
| 4,245,136 A | 1/1981 | Krauel, Jr. |
| 4,256,922 A | 3/1981 | Gorike |
| 4,265,122 A | 5/1981 | Cook et al. |
| 4,284,921 A | 8/1981 | Lemonon et al. |
| 4,289,936 A | 9/1981 | Civitello |
| 4,295,214 A | 10/1981 | Thompson |
| 4,322,877 A | 4/1982 | Taylor |
| 4,378,596 A | 3/1983 | Clark |
| 4,385,210 A | 5/1983 | Marquiss |
| 4,418,248 A | 11/1983 | Mathis |
| 4,418,404 A | 11/1983 | Gordon et al. |
| 4,419,545 A | 12/1983 | Kuindersma |
| 4,429,193 A | 1/1984 | Busch-Vishniac et al. |
| 4,429,194 A | 1/1984 | Kamon et al. |
| 4,432,079 A | 2/1984 | Mackelburg et al. |
| 4,433,750 A | 2/1984 | Neese |
| 4,434,327 A | 2/1984 | Busch-Vishniac et al. |
| 4,439,642 A | 3/1984 | Reynard |
| 4,471,172 A | 9/1984 | Winey |
| 4,480,155 A | 10/1984 | Winey |
| 4,503,553 A | 3/1985 | Davis |
| 4,550,228 A | 10/1985 | Walker et al. |
| 4,558,184 A | 12/1985 | Busch-Vishniac et al. |
| 4,593,160 A | 6/1986 | Nakamura |
| 4,593,567 A | 6/1986 | Isselstein et al. |
| 4,600,891 A | 7/1986 | Taylor, Jr. et al. |
| 4,672,591 A | 6/1987 | Breimesser et al. |
| 4,695,986 A | 9/1987 | Hossack |
| 4,703,462 A | 10/1987 | Woodsum |
| 4,751,419 A | 6/1988 | Takahata |
| 4,784,915 A | 11/1988 | Sakagami et al. |
| 4,803,733 A | 2/1989 | Carver et al. |
| 4,809,355 A | 2/1989 | Drefahl |
| 4,823,908 A | 4/1989 | Tanaka et al. |
| 4,837,838 A | 6/1989 | Thigpen et al. |
| 4,885,781 A | 12/1989 | Seidel |
| 4,887,246 A | 12/1989 | Hossack et al. |
| 4,888,086 A | 12/1989 | Hossack et al. |
| 4,903,703 A | 2/1990 | Igarashi et al. |
| 4,908,805 A | 3/1990 | Sprenkels et al. |
| 4,939,784 A | 7/1990 | Bruney |
| 4,991,148 A | 2/1991 | Gilchrist |
| 4,991,687 A | 2/1991 | Oyaba et al. |
| 5,054,081 A | 10/1991 | West |
| 5,079,751 A | 1/1992 | Woodward |
| 5,095,509 A | 3/1992 | Volk |
| 5,109,416 A | 4/1992 | Croft |
| 5,115,672 A | 5/1992 | McShane et al. |
| 5,142,511 A | 8/1992 | Kanai et al. |
| 5,153,859 A | 10/1992 | Chatigny et al. |
| 5,181,301 A | 1/1993 | Wheeler |
| 5,276,669 A | 1/1994 | Oohashi et al. |
| 5,287,331 A | 2/1994 | Schindel et al. |
| 5,317,543 A | 5/1994 | Grosch |
| 5,357,578 A | 10/1994 | Taniishi |
| 5,392,358 A | 2/1995 | Driver |
| 5,406,634 A | 4/1995 | Anderson et al. |
| 5,430,805 A | 7/1995 | Stevenson et al. |
| 5,487,114 A | 1/1996 | Dinh |
| 5,539,705 A | 7/1996 | Akerman et al. |
| 5,572,201 A | 11/1996 | Graham et al. |
| 5,582,176 A | 12/1996 | Swerling et al. |
| 5,619,383 A | 4/1997 | Ngai |
| 5,638,456 A | 6/1997 | Conley et al. |
| 5,649,019 A | 7/1997 | Thomasson |
| 5,662,190 A | 9/1997 | Abe |
| 5,666,327 A | 9/1997 | Medeiros et al. |
| 5,700,359 A | 12/1997 | Bauer |
| 5,745,582 A | 4/1998 | Shimpuku et al. |
| 5,748,758 A | 5/1998 | Menasco, Jr. et al. |
| 5,758,177 A | 5/1998 | Gulick et al. |
| 5,767,609 A | 6/1998 | Suganuma |
| 5,809,400 A | 9/1998 | Abramsky et al. |
| 5,832,438 A | 11/1998 | Bauer |
| 5,844,998 A | 12/1998 | Nageno |
| 5,859,915 A | 1/1999 | Norris |
| 5,885,129 A | 3/1999 | Norris |
| 5,889,870 A | 3/1999 | Norris |
| 5,892,315 A | 4/1999 | Gipson et al. |
| 5,919,134 A | 7/1999 | Diab |
| 5,982,805 A | 11/1999 | Kaneda |
| 6,011,855 A | 1/2000 | Selfridge et al. |
| 6,044,160 A | 3/2000 | Norris |
| 6,052,336 A | 4/2000 | Lowrey, III |
| 6,064,259 A | 5/2000 | Takita |
| 6,104,825 A | 8/2000 | Thigpen |
| 6,108,427 A | 8/2000 | Norris et al. |
| 6,108,433 A | 8/2000 | Norris |
| 6,151,398 A | 11/2000 | Norris |
| 6,188,772 B1 | 2/2001 | Norris et al. |
| 6,205,104 B1 | 3/2001 | Nagashima et al. |
| 6,229,899 B1 | 5/2001 | Norris et al. |
| 6,232,833 B1 | 5/2001 | Pullen |
| 6,304,662 B1 | 10/2001 | Norris et al. |
| 6,356,872 B1 | 3/2002 | Leung et al. |
| 6,359,990 B1 | 3/2002 | Norris |
| 6,378,010 B1 | 4/2002 | Burks |
| 6,445,804 B1 | 9/2002 | Hirayanagi |
| 6,556,687 B1 | 4/2003 | Manabe |
| 6,577,738 B2 | 6/2003 | Norris et al. |
| 6,584,205 B1 * | 6/2003 | Croft et al. ............... 381/98 |
| 6,606,389 B1 * | 8/2003 | Selfridge et al. ............. 381/111 |
| 6,666,374 B1 | 12/2003 | Green et al. |
| 6,678,381 B1 | 1/2004 | Manabe |
| 6,768,376 B2 | 7/2004 | Hoyt et al. |
| 6,771,785 B2 | 8/2004 | Pompei |
| 6,850,623 B1 | 2/2005 | Norris et al. |
| 6,859,096 B2 | 2/2005 | Tanaka et al. |
| 7,162,042 B2 * | 1/2007 | Spencer et al. ............... 381/77 |
| 2001/0007591 A1 | 7/2001 | Pompei |
| 2002/0101360 A1 | 8/2002 | Schrage |
| 2002/0191808 A1 | 12/2002 | Croft, III et al. |
| 2005/0207587 A1 | 9/2005 | Pompei |

FOREIGN PATENT DOCUMENTS

| | | |
|---|---|---|
| EP | 0 973 152 | 1/2000 |
| JP | 360021695 A | 2/1985 |
| JP | 2265397 | 10/1990 |
| JP | H2-265400 | 10/1990 |

| WO | WO 98/02978 | 1/1998 |
| WO | WO 98/49868 | 4/1998 |
| WO | WO 99/35881 | 7/1999 |
| WO | WO 99/35884 | 7/1999 |
| WO | WO 01/08449 | 2/2001 |
| WO | WO 01/33902 | 5/2001 |
| WO | WO 01/52437 | 7/2001 |

OTHER PUBLICATIONS

Ultrasonic Ranging System by Polaroid Corporation.

Excerpts From on Combination Tones by Helmholtz, Editor's Comments on Paper 16, pp. 228-238.

Aoki, Kenichi et al. Parametric Loudspeaker—Characteristics of Acoustic Field and Suitable Modulation of Carrier Ultrasound, Electronics and Communications in Japan, Part 3, vol. 74, No. 9, pp. 76-82 (1991).

Makarov et al, "Parametric Acoustic Nondirectional Radiator", Acustica, vol. 77, pp. 240-242 (1992).

Yoneyama, et al, "The Audio Spotlight: An Application of Nonlinear Interaction of Sound Waves to a New Type of Loudspeaker Design", J. Acoustical Society of America 73(5), May 1983, pp. 1532-1536.

Crandall, I.B. The Air-Damped Vibrating System: Theoretical Calibration of the Condenser Transmitter, American Physical Society, Dec. 28, 1917, pp. 449-460.

Peter J. W., "Parametric Acoustic Array", The Journal of the Acoustical Society of America, vol. 35, No. 1, Apr. 1963, pp. 535-537.

Wagner, Ronald, Electrostatic Loudspeaker Design and Construction, Chapters 4 and 5, pp. 59-91, Audio Amateur Press Publishers, 1993.

Berktay, H.O., "Possible Exploitation of Non-Linear Acoustics in Underwater Transmitting Applications", Department of Electronic and Electrical Engineering University of Birmingham, Edgbaston, Birmingham 15, England (Received Apr. 13, 1965).

Berktay, H.O. et al. "Arrays of Parametric Receiving Arrays," The Journal of the Acoustical Society fo America, pp. 1377-1383.

Piwnicki, Konrad, "Modulation Methods Related to Sine-Wave Crossings" IEEE Transactions on Communications, 1983, pp. 503-508, vol. COM-31, No. 4.

Marvasti, Farokh, "Modulation Methods Related to Sine Wave Crossings" IEEE Transactions on Communications, 1985, pp. 177-178, vol. COM-33, No. 2.

Pompei; The Use of Airborne Ultrasonics for Generating Audible Sound Beams; Presented at the 105th Convention Sep. 26-29, 1998.

Moffett et al. "Model for parametric acoustic sources." J. Acoust. Soc. Am., Feb. 1977, pp. 325-337, vol. 61. No. 2.

Kamakura, et al.; Suitable Modulation of the Carrier Ultrasound for Parametric Loudspeaker; Acustica vol. 73 (1991).

Berktay, et al.; Nearfield effects in end-fire line arrays; The Journal of the Acoustical Society of America; 1973; pp. 550-556.

Kamakura et al. "Developments of Parametric Loudspeaker for Practical Use." 10th International Symposium on Nonlinear Acoustics, 1984, pp. 147-150.

Muir, et al.; Parametric Acoustic Transmitting Arrays; The Journal of the Acousticval Society of America; 1972; pp. 1481-1485.

Kite et al. "Parametric Array in Air: Distortion Reduction by Preprocessing," Applied Research Laboratories, University of Texas, 2 pages, 1997.

Kite et al. "Parametric Array in Air: Distortion Reduction by Preprocessing," Applied Research Laboratories, University of Texas, 11 pages, 1997.

Willette et al. "Harmonics of the difference frequency in saturation-limited parametric sources." J. Acoust. Soc. Am., Dec. 1977, pp. 1377-1381, vol. 62, No. 6.

Havelock, et al., Directional Loudspeakers Using Sound Beams; J. Audio Eng. Soc., vol. 48, No. 10, Oct. 2000; pp. 908-916.

Kamakura, et al., A Study for the Realization of a Parametric Loudspeaker, 1985; pp. 1-18.

* cited by examiner

AUDIO DISTORTION CORRECTION FOR A PARAMETRIC REPRODUCTION SYSTEM

PRIORITY CLAIM

Priority is claimed to copending U.S. Provisional Patent Application Ser. No. 60/919,838, filed Mar. 22, 2007, which is hereby incorporated herein by reference in its entirety.

BACKGROUND

Parametric audio reproduction systems produce sound through the heterodyning of two acoustic signals in a non-linear process that occurs in a medium such as air. The acoustic signals are typically in the ultrasound frequency range. The non-linearity of the medium results in acoustic signals produced by the medium that are the sum and difference of the acoustic signals. Thus, two ultrasound signals that are separated in frequency can result in a difference tone that is within the 60 Hz to 20,000 Hz hearing range of humans.

Additional non-linearities in parametric audio reproduction systems occur at the transducers used to generate the ultrasound signals. Further distortion can be caused by various harmonics and other audio artifacts that are inherent in parametric reproduction. The inherent distortion in parametric reproduction processes caused by the various non-linearities and distortions has been problematic.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
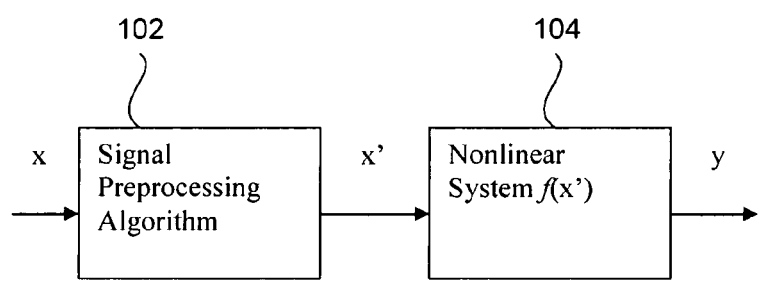
FIG. 1 is a schematic block diagram representation of preprocessing in a generalized non-linear system.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

It has been realized that reduction of distortion in a non-linear system such as an audio reproduction system, including that comprising a parametric array, can be improved using a function that closely approximates system response including inherent distortion. Once this function is understood and defined, an inverse function can be derived and used for preprocessing. This inverse function in effect conditions the input signal so that when it is fed into the non-linear system the original input signal (before conditioning) is recovered in the output with much less distortion than would otherwise be the case. This alteration of the input signal is a dynamic process and itself changes with the input signal, as the function used in preprocessing will be dependent on the input signal just as the system response upon which it was based changes with the input signal.

The system output is in effect linearized with respect to the input, or more properly, at each instant the signal in the output is recovered to a value that is directly proportional to the input value. It will be understood that the response of the underlying system itself is not linearized. This is an important distinction to make in some applications. For example parametric reproduction in a real sense requires non-linearity to produce audio output. This process allows the non-linear response to occur, and yet recover the original signal in the output.

In one example this is done using at least some part of an infinite series expression of a non-linear system transfer function, expressed mathematically, which defines the expected distortion imparted by the system. The solved inverse of this nonlinear system transfer function is the function used in preprocessing. As will be more fully appreciated from the discussion below, "solved inverse" in this context implies solving for the expression which is the true inverse, not just switching the variables (e.g. x for y in a graphical analogy and vice-versa) nor by simply compensating for signal gain, or the like.

In one example we first examine the system and ascertain its properties. Specifically, the distortion expected in the non-linear system output due to at least one cause or factor is defined. Or put another way, a function defining what happens to the input when it passes through the system is determined and represented by a mathematical equation. The total system response can be considered in this equation in one example. In another example a deviation from a linear response can be mathematically represented. In another example system response due to one of a plurality of factors affecting total system response can be represented mathematically.

This definition of system response can be established by mathematical modeling. In another example it can be established by means of empirical investigation, and then determining a function expression that fits the data. Infinite series theorems and other conventional numerical methods can be used to define the function. In any case, the function which closely approximates the non-linear system response that leads to distortion of interest is expressed mathematically.

The mathematically expressed or expressible function defining distortion of the input expected in the output (the "non-linear system transfer function") is then manipulated to find its inverse, solving in terms of one or more variables of interest with respect to the other variables of interest (not just exchanging variables) as exemplified by the equations set out below. This is done with a view towards being able to recover the original input in the output (i.e. obtain an output value directly proportional to the input value).

Since a mathematical expression of a non-linear system transfer function in most cases will not be in closed form, it can be expressed—at least in part—as an infinite series. This series expression will as a practical matter likely be defined as a polynomial of "N" terms. The non-linear system transfer function is then manipulated to find its inverse, as mentioned. In any event a "preprocessing transfer function" can be created relating the input signal (or more properly one or more parameters of the input signal) to a change or "pre-distortion" of the input signal. This preprocessing transfer function, when applied in a preprocessing scheme, determines the conditioned or "pre-distorted" signal to be fed into the system with a view to having it output from the system with distortion mitigated. The approximation may yield error, but if the error causes less distortion than the system otherwise produces it is a net improvement. It has been found that the method can reduce distortion from non-linear response in a parametric array dramatically to have distortion levels that are comparable to conventional acoustic reproduction systems.

Parameters of interest in defining and using the non-linear system transfer function and preprocessing transfer function may include (but are not limited to): input signal magnitude, frequency, signal magnitude envelope; rate of change of the signal magnitude, rate of change of the frequency, and rate of change of the signal magnitude envelope; and/or some combination or derivative of these parameters. The parameters that are significant depend upon the audio system under consideration. For parametric audio systems the behavior of the envelope of the audio input signal as well as the magnitude of the signal are very relevant. The parameters relevant to these are therefore quite important. Other parameters can be quite relevant in other kinds of audio systems.

Depending on how the correction system is set up, the pre-distortion is determined by the preprocessing transfer function (which can be dynamically changing with the input signal) and, in various example implementations, is either: a) determined as a value to be added to the input at each time instant; b) determined as a scalar value, and the input is multiplied by the scalar value at each time instant; or c) determined so that the output of the preprocessing transfer function is itself the corrected (pre-distorted) input signal for the non-linear system. Precisely how the input signal is altered depends upon the audio system. In any case one or more parameters of the input signal is/are sampled and fed into the preprocessing transfer function, and based on the result, one or more parameters of the output of the preprocessing transfer function are altered. Whether a correction is determined and applied to create the pre-distortion or the pre-distorted signal itself is the output of the preprocessing transfer function, the result desired is this pre-distorted signal. In digital implementations this will be done by sampling the input at a selected clock interval. In analog implementations the values of the input and output of the preprocessing transfer function are continuously changing and are coordinated with each other in time. A variety of ways of implementing the concept will be apparent to one skilled in the art.

In one example set out in detail below the parameters of the input signal used are the magnitude of the input (i.e. voltage) and the behavior of the input signal envelope (specifically that of a defined value "u" which is dependant on the trend of the envelope more than its magnitude at any instant). The pre-distortion created by the preprocessing changes the input signal, altering the magnitude (voltage) at each time instant in the examples. This will be more fully explained below.

In one example using parametric reproduction technology available at the time of this disclosure, the sound pressure level (SPL) of the output is not great enough to be fully in saturation all the time. Rather, it is essentially constantly moving in the transition between lower-power non-saturated (or weak saturation) in character, and higher-power higher-SPL output strongly saturated in character, where compressibility effects (or rather shock effects) are more dominant, and back again: varying with input signal program material level, for example. Using an approximation of expected distortion based on the actual level within this transition to pre-process the input signal has not been effectively implemented to the inventors' knowledge prior to this time. The method disclosed herein enables this.

In one example dual side band (DSB) modulation is used and a non-linear system transfer function comprising a selected number N of terms in a Taylor series is used. The selection of N is predicated on a balance of desired precision and convenience, as a larger number of terms gives rise to additional labor in solving for the inverse function. After a few terms of the series are defined, each new terms adds incrementally less accuracy and upper extension of valid results in view of extending the preprocessing transfer function farther into the transition between the situations mentioned (that of no compressibility affecting the output, and of full saturation in the output). Moreover, as SPL increases, the net change to the input made by the preprocessing transfer function decreases. If SPL is high enough (saturation predominates) the system becomes essentially linear in response, and then simple amplitude modulation (AM) with no preprocessing yields an essentially correct output. Therefore as just alluded to, at some level the correction scheme can potentially simply be replaced by AM without correction of the kind under discussion, as they achieve the same result in saturation (high) output levels. Where the Taylor series preprocessing transfer function is burdensome, particularly where DSB is being used, at saturation levels it can be beneficial to switch over to simple AM.

There may be a gap in signal input level ranges between where an N term preprocessing function yields accurate results and essentially full saturation where AM can be used. To bridge a gap between the output SPL (i.e. input signal voltage) where a series expression with N selected terms ceases to yield valid results and a voltage (output SPL) and where pure AM can be used with essentially no harmonic distortion (full saturation) as will be further discussed herein, a polynomial expression can be used to approximate the output distortion and can be similarly treated to obtain a preprocessing transfer function over this output level region in this example.

In this disclosure, for consistency, when a number of terms is specified for a transfer function, it is the number of terms in the non-linear system transfer function that is meant. The preprocessing transfer function expression may, and likely will, have more terms than the number of terms in the series expression it was based on. However, for simplicity, when referring to a preprocessing transfer function as an "'N'-term" series, or an "'N'-order" series (or function in either case), it is the number of terms (N) of the non-linear system transfer function it is based on that is meant.

In another example a modified two-term Taylor series is used over the entire range up to where pure AM can be used if desired. This will be discussed further below. And in another example a low-order Taylor series expansion is used where it is valid and a further polynomial expression defining an approximation of response is applied over the invalid range mentioned in another variation on implementation. Simple AM is used in signal level ranges where saturation predominates.

It will be appreciated from the discussion below that when enough terms are used in the series, or the preprocessing transfer function otherwise closely follows theoretical predictions, the result of the correction scheme can be a parametric system output with distortion that is very low in comparison to prior systems known in the art. Depending on the modulation scheme and the corresponding mathematical model of the system response (the non-linear system transfer function), the series expression of the preprocessing transfer function can look different in each case, but will function essentially as described herein.

In the examples, a DSB modulation scheme can be used. It has been found that using the information set forth below, the output will match the predictions and distortion will be greatly reduced. The scheme can also be applied to other modulation schemes such as single sideband (SSB) modulation, unbalanced sidebands (e.g. truncated dual sideband (DSB)), and so forth, as long as the non-linear system transfer function can be defined for the system and the implementation takes into consideration the particular modulation scheme used.

A DSB modulation scheme can be advantageous in implementations where a switch over to simple AM (no preprocessing) at high SPL is contemplated, as will be apparent. This is especially true where many terms of the series are used. For example, in some instances more than 5 terms may be used. In other instances, 50 or more terms may be used for sufficient accuracy. In some situations, microprocessor limitations may make real time calculation difficult. Developing a look-up table can potentially be used to simplify part or all of the implementation in real signal processor hardware and software. On the other hand, if the algorithm used requires a look-up table with a plurality of arguments for the system under consideration, then the number of values in the table can become large, and again hardware limitations may impinge on implementation. One solution to this dilemma is to use a series polynomial of few terms, and further correct as necessary with other approximating polynomials.

Another example implementation is to pre-record program material using powerful processors not readily adaptable to individual system implementations. As will be appreciated, a large N is less of a problem when a large computer and a large amount of time for processing are available. Once the preprocessed program material is prepared, individual pre-distorted copies of the program can be made. These pre-distorted copies can be used to play the pre-distorted material through a user's end system, enabling the original non-preprocessed signal to be substantially reproduced in the parametric array output.

With this description of the distortion correction in general terms in mind, examination will now be made of specific examples of mathematical expressions usable as preprocessing transfer functions.

Case 1: Nonlinear System Distortion Correction Generally

Let x and y be the input and output of a nonlinear system, respectively. Then a general nonlinear system can be described as $$y = f(x) \qquad (1)$$

Apply a Taylor series expansion, and Equation (1) in general can be written as a Taylor Series:

$$y = C_1 x + C_2 x^2 + C_3 x^3 + C_4 x^4 + \ldots \qquad (2)$$

Note that Equation (2) reduces to a linear system when $C_n = 0$, $n = 2, 3, 4, \ldots$, or in other words when only $C_1$ is non-zero.

For a second order nonlinear system transfer function, Equation (2) reduces to $y = C_1 x + C_2 x^2$, where $C_1 \neq 0$ and $C_2 \neq 0$. For a third order nonlinear system transfer function, Equation (2) reduces to $y = C_1 x + C_2 x^2 + C_3 x^3$, where among the three coefficient, at least $C_1 \neq 0$ and $C_3 \neq 0$, while the coefficient $C_2$ can be zero or non-zero. For a forth order nonlinear system transfer function, Equation (2a) reduces to $y = C_1 x + C_2 x^2 + C_3 x^3 + C_4 x^4$, where among the three coefficients, at least $C_1 \neq 0$ and $C_4 \neq 0$, while the coefficients $C_2$ and $C_3$ can be zero, or non-zero; and so on, the pattern continuing for higher-order system transfer functions.

Physically, if the input is a sinusoidal wave $x = \sin(2\pi f_0 t)$, then a linear system preserves the frequency component $f_0$. A second order nonlinear system will produce both a fundamental $f_0$, and a second harmonic $2f_0$. A third order nonlinear system will produce a fundamental $f_0$, a second harmonic $2f_0$, and a third harmonic $3f_0$. A fourth order nonlinear system will produce a fundamental $f_0$, a second harmonic $2f_0$, a third harmonic $3f_0$, and a fourth harmonic $4f_0$, and so on.

In order to recover the frequency component of the input signal, a signal preprocessing scheme, such as was described above, is needed. As shown in FIG. 1, the input signal x is preprocessed for a particular nonlinear system using a signal preprocessing algorithm 102. The output of the preprocessing algorithm, x' (now "pre-distorted") is input into the non-linear system 104. At the output of the system, the signal y is proportional to the input signal x. Note that the system itself remains nonlinear. This scheme linearizes the output with respect to the input by circumventing the non-linearity, not altering its essential character.

Now let's look at what preprocessing algorithms are needed for higher order systems, e.g. those that can be defined by second, third, and fourth order nonlinear system transfer functions.

For a second order nonlinear system transfer function, $$y = C_1 x' + C_2 x'_2 = f(x') = x \qquad (3)$$

Solving for x' in equation (3), we obtain:

$$x' = \frac{-C_1 \pm \sqrt{C_1^2 + 4 C_2 x}}{2 C_2}. \qquad (4)$$

In equation (4), the preprocessing transfer function can serve as the basis for a preprocessing algorithm for a second order nonlinear system. Whether a + or − sign will be chosen depends on the real system being modeled.

For a third order nonlinear system transfer function the equation, $$y = C_1 x' + C_2 x'^2 + C_3 x'^3 = x \qquad (5)$$

can be used. Solving Equation (5), we get $$x'_1 = \frac{s^{1/3}}{6C_3} - \frac{6C_1C_3 - 2C_2^2}{3C_3 s^{1/3}} - \frac{C_2}{3C_3}, \quad (6)$$

$$x'_2 = -\frac{s^{1/3}}{12C_3} + \frac{3C_1C_3 - C_2^2}{3C_3 s^{1/3}} - \frac{C_2}{3C_3} + \frac{\sqrt{3}\,i}{2}\left(\frac{s^{1/3}}{6C_3} + \frac{6C_1C_3 - 2C_2^2}{3C_3 s^{1/3}}\right),$$

$$x'_3 = -\frac{s^{1/3}}{12C_3} + \frac{3C_1C_3 - C_2^2}{3C_3 s^{1/3}} - \frac{C_2}{3C_3} - \frac{\sqrt{3}\,i}{2}\left(\frac{s^{1/3}}{6C_3} + \frac{6C_1C_3 - 2C_2^2}{3C_3 s^{1/3}}\right),$$

where $$s = 36C_1C_2C_3 + 108C_3^2 x - 8C_2^3 +$$
$$12\sqrt{3}\,C3(4C_1^3C_3 - C_1^2C_2^2 + 18C_1C_2C_3 x + 27C_3^2 x^2 - 4C_2^3 x)^{1/2}.$$

Equation (6) can serve as the preprocessing transfer function basis of the preprocessing algorithm for the third order nonlinear system. Whether $x'_1$, $x'_2$ or $x'_3$ will be chosen to use as the basis of it depends on a real system parameter being modeled and corrected by the preprocessing scheme. Equation (6) looks formidable. However, for a practical nonlinear system, these expressions forming the bases of algorithms can likely be greatly simplified, once the coefficients $C_1$, $C_2$ and $C_3$ particular to a real world system are known.

Similarly the corresponding preprocessing algorithms for a fourth order or higher order nonlinear system transfer function can be derived (as will be done below). It will be appreciated that the algorithms will become more complicated when the order of non-linearity is higher. However, these multiple term preprocessing schemes can serve as the general guiding principles for reducing the distortion of the original input signal as it appears when recovered in the output of nonlinear audio systems.

In order to determine the actual values, It is first necessary to resolve what the nonlinear system transfer function—Equation (1)—would be for a real system. This is then used to solve for an inverse function as the above examples illustrate. This inverse is the basis for a preprocessing transfer function, which in turn is the basis for the preprocessing to be applied.

Case 2: Parametric Acoustic Reproduction Systems

While the invention is not strictly limited to parametric audio reproduction, the use of preprocessing is very helpful there, and parametric audio reproduction examples shall be used. Audio signals generated by a parametric array in its farfield are expressed as a function of the audio envelope. The audio distortion correction algorithms are proposed for low level, moderate and higher sound pressure levels (SPL) approaching saturation ultrasound levels.

The parametric generation of sound was observed by Bellin and Beyer in 1962 and a theoretical analysis was developed by Westervelt in 1963. An experiment that opened the possibility of the parametric array in air was done by Bennett and Blackstock in the mid-1970's. Generation of a broadband audible signal through a parametric array was reported by Yoneyama et al. in 1983, who introduced the term 'audio spotlight' for audio application of a parametric array. In their experiment, an array of piezoelectric transducers was used to project amplitude-modulated ultrasound at 120 dB SPL and higher. It was shown that the parametric array in air could generate a broadband audio signal at reasonable loudness, although it suffered from limited frequency response and harmonic distortion. These two issues—poor frequency response and harmonic distortion—are inevitable consequences of the nonlinear interaction processes in parametric sound reproduction.

In 1965, Berktay derived a simple expression that is widely used to try to predict the farfield response of a parametric array. Briefly, and in general terms, Berktay's expression predicts that the resulting low frequency waveform along the axis of the beam of the parametric array is proportional to the second time derivative of the square of the amplitude modulation envelope. This explains a 12 dB per octave roll-off in frequency response and harmonic distortion in the demodulated signal. There have been algorithms proposed with a view to improving the frequency response and lessening the harmonic distortion. It has been suggested that integrating twice and taking the square root of the audio envelope reduces the harmonic distortion and improves the frequency response. It has been suggested that harmonic distortion can be improved by square-rooting the audio signal. A square rooting scheme can be implemented real-time but in theory requires infinite transducer bandwidth.

Spencer and Croft et al. propose the first examples of the present approach in the parent case to this disclosure, which is set forth in U.S. Pat. Nos. 6,584,205 B1 and 7,162,042 B2, which disclosure is hereby incorporated herein by reference for the teachings consistent herewith, and to the extent inconsistent, this document shall control for the purposes of this disclosure. In any case the reader's attention is directed to the prior disclosure. As an aside, in addition to the polynomial approximation approach disclosed, a recursive scheme was disclosed. The recursive algorithm suggested in the prior disclosure requires only limited transducer bandwidth but needs larger memory to store the computation data and processing time to accomplish the necessary repetitive calculations. Both the AM modulation with square-rooting algorithm and the SSB Modulation with a recursive algorithm are applied to the Berktay's solution which implies better results at low ultrasound levels with increasing difficulties as SPL rises.

As mentioned, a polynomial approximation of distortion and a needed correction or compensation based thereon is suggested in the prior disclosure wherein a preprocessing transfer function (be it expressed as a polynomial having a plurality of terms, or an exponential function, or other form) is developed based on an expression which models distortion. The approximation is applied to the incoming audio signal before it passes through the distortion-inducing parametric system in order to pre-distort it so as to reduce the distortion actually obtained. This disclosure sets forth improved methods for doing this.

Returning to consideration of Berktay's solution, a parametric output should be distortion free for a single audio frequency tone produced by two ultrasonic waves, i.e., with SSB modulation. However, in practice it is found that high distortion can be present while testing a single audio tone. THD (Total Harmonic Distortion) ranges between a few percentage points to as high as 70-80% depending on factors such as emitter size, resonant frequency of the emitter(s), input ultrasound level, and the testing distance, among other factors. The distortion mentioned should not be thought to be completely generated within the emitter itself.

Much of the distortion is due to nonlinear interaction of the ultrasound waves in the medium, typically air, and particularly at higher SPLs. Empirically it has been found that distortion is small close to the emitter, and increases with distance. Distortion stops increasing with distance and levels out at the transition between the near-field and far-field regions.

This also suggests that the distortion peculiar to parametric systems is primarily not produced directly by the emitter nor other potential distortion sources prior to the impartation of the signal to the air medium at the emitter.

Berktay's solution suggests using square rooting of the input signal and this has been found to work for low SPL output. However, when SPL is increased distortion again begins to be a problem.

Conversely, at high SPLs where saturation predominates, Merklinger's solution (as referenced below) holds. As will be apparent, this implies that in full saturation there is essentially no distortion using pure AM (DSB) modulation of the carrier by the input audio signal. That these two conditions exist at the low end and high end of a range of levels was known, but how to cover the range of SPL between them was the problem the parent disclosure addressed and is the problem that is further addressed in the present disclosure.

The following discussion will characterize the far-field solution/equation/model of the output of the parametric array and discuss the relevant distortion correction schemes, particularly in the range of output SPL between that where Berktay's solution holds and that where Merklinger's solution holds. A Taylor series expansion defining a non-linear system transfer function in a general solution based on theoretical prediction is used to express the output of the parametric array regardless whether the primaries (carrier waves) are weak or strong. This solution will also lead to Berktay's solution for weak non-linearity at low SPLs; and to Merklinger's solution when the primary waves are in shock throughout the parametric array, i.e., essentially fully in saturation. The distortion correction schemes with AM modulation for both the general and saturation cases will also be addressed. The general solution of the parametric array will be briefly summarized in its farfield regardless of the amplitude of the primary waves. Characteristics of the two limiting cases (Berktay and Merklinger) are summarized as well.

General Solution for a Parametric Acoustic Array

The mathematical derivation of a solution for a parametric array in its farfield is presented by Merklinger (H. M. Merklinger, "Improved efficiency in the parametric transmitting array," J. Acoust. Soc. Am., Vol. 58, No. 4, pp. 784-787, 1975). A Taylor series expansion of the solution is employed to write the solution in terms of the magnitude (power) of the envelope function squared. This solution will serve as the basis for distortion correction algorithms regardless of the ultrasound amplitude. A few key steps of the derivation are set forth, leading to equation (10) below.

Taking the primary wave (ultrasonic carrier) as a collimated plane wave having cross section area S and traveling along the x axis, the waveform at the transducer is expressed (as an amplitude modulated carrier) as follows:

$$p_p(t) = P_0 E(t) \sin \omega_0 t \quad (7)$$

where $P_0$ is the primary wave pressure amplitude, $E(t)$ is the envelope function, $\omega_0 = 2\pi f_0$ is the primary angular frequency and $f_0$ is the primary frequency. As this wave travels along the x axis, it suffers attenuation due, for example, to thermoviscous absorptions and to nonlinear absorptions. Merklinger suggested that a primary wave at a distance x is of the form $$p_p(x, t) = \frac{P_0 E(t - x/c_0) \exp(-\alpha x) \sin(\omega_0 t - k_0 x)}{\{1 + [\beta \omega_0 P_0 E(t - x/c_0)(1 - \exp(-2\alpha x)/4\rho_0 c_0^3 \alpha]^2\}^{1/2}} \quad (8)$$

$$= E'(x, t - x/c_0) \sin(\omega_0 t - k_0 x),$$

where $\alpha$ is the thermoviscous attenuation coefficient, $\rho_0$ is the air density, $c_0$ is the sound velocity, $k_0 = \omega_0/c_0$ is the wave number of the carrier and $\beta$ is the nonlinearity parameter in air. $E'(x, t-x/c_0)$ contains the range and modulation dependent terms describing the primary waves.

The virtual source density as given by Westervelt (P. J. Westervelt, "Parametric Acoustic Array," J. Acoust. Soc. Am., Vol. 35, No. 4, pp. 535-537, 1963) is $$q(x, t) = \frac{\beta}{\rho_0^2 c_0^4} \frac{\partial}{\partial t} p_p^2(x, t). \quad (9)$$

The time-dependent part of Equation (8), when squared, leads to two terms. One contributes to the lower frequency (secondary) wave and the other to the second harmonic of the primary wave. Neglecting the second harmonic of the primary waves, we obtain:

$$q(x, t) = \frac{\beta}{2\rho_0^2 c_0^4} \frac{\partial}{\partial t} [E'(x, t - x/c_0)]^2. \quad (10)$$

These sources give rise to an on-axis farfield sound pressure at range r given by:

$$p_s(r, t) = \rho_0 \frac{\partial}{\partial t} \int_o^r \frac{S}{4\pi r} q\left(x, t - \frac{r-x}{c_0}\right) dx \quad (11)$$

$$= \frac{\beta S}{8\pi \rho_0 c_0^4 r} \frac{\partial^2}{\partial t^2} \int_0^r \left[E'\left(x, t - \frac{r}{c_0}\right)\right]^2 dx.$$

If r is in the farfield, there will be negligible error introduced if we let the upper limit of integration go to infinity. Substituting the complete expression for $E'$ $(x, t-r/c_0)$ and integrating, we obtain:

$$p_s(r, t) = \frac{SP_0}{4\pi \omega_0 r c_0} \frac{\partial^2}{\partial t^2} \left\{ E(t - r/c_0) \tan^{-1}\left[\frac{\beta \omega_0 P_0}{4\rho_0 c_0^3 \alpha} E(t - r/c_0)\right]\right\}. \quad (12)$$

Recall that the plane wave shock formation distance is defined as $$l_s = \frac{\rho_0 c_0^3}{\beta \omega_0 P_0}, \quad (13)$$

and the parametric array length limited by thermoviscous absorption is defined as, $$l_a = 1/\alpha. \quad (14)$$

Equation (12) can then be rewritten as:

$$p_s(r, t) = \frac{SP_0}{4\pi \omega_0 r c_0} \frac{\partial^2}{\partial t^2} \{E(\tau) \tan^{-1}[uE(\tau)]\}, \quad (15)$$

where $\tau=t-r/c_0$ is the retarded time, $$\Gamma = \frac{l_\alpha}{l_s} = \frac{\beta\omega_0 P_0}{\rho_0 c_0^3 \alpha}$$

is the Goldberg number (or the acoustic Reynold number), and $$u = \frac{\Gamma}{4}$$

which is defined as the ultrasound pressure level index in this disclosure. By expanding the arctangent part in the form of the Taylor series, we have:

$$p_s(r,t) = \frac{SP_0}{4\pi\omega_0 rc_0} \tag{16}$$

$$\frac{\partial^2}{\partial t^2} E(\tau) \times \left\{ [uE(\tau)] - \frac{1}{3}[uE(\tau)]^3 + \frac{1}{5}[uE(\tau)]^5 - \frac{1}{7}[uE(\tau)]^7 + \ldots \right\}.$$

Generally speaking, it requires an infinite number of terms in Equation (16) to accurately express the secondary wave output sound pressure $p_s(r,t)$. However, only the first few terms will generally be used in reality for practical reasons. How many terms are required to approximate $p_s(r,t)$ depends on the primary frequency $f_0$ and its sound pressure level $P_0$. If the SPL is higher, more terms are required, generally speaking. (See FIG. 10.) However, as the SPL approaches saturation, the results from the series also approach the same value that is obtained using simple AM with no other correction as mentioned per Berktay. (See FIG. 10.)

Figure 10:
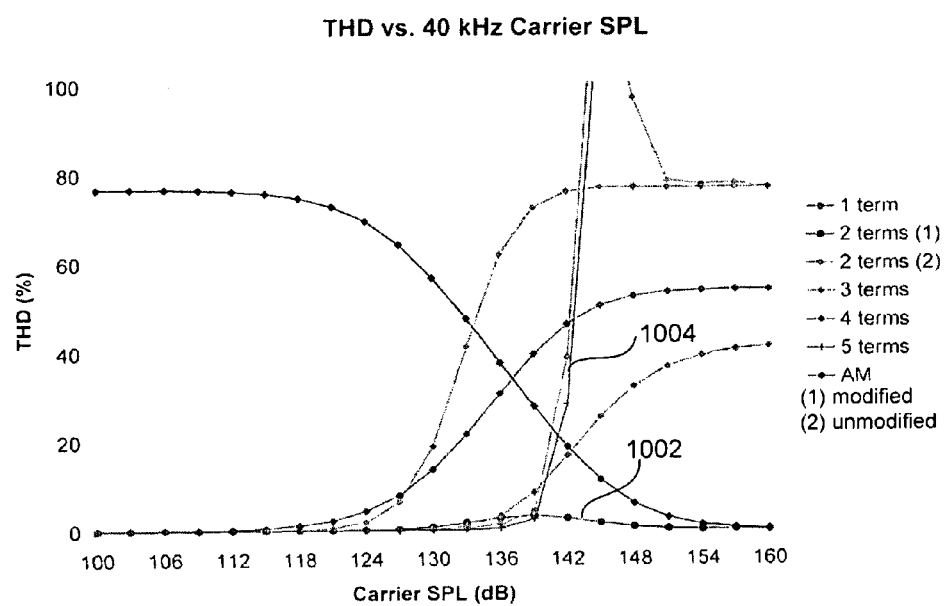
FIG. 10 is a plot of THD vs. primary signal level (at 40 kHz) for AM modulation with no correction, a one, two, three, four and five-term truncated series expression-based preprocessing transfer function, and, a modified two-term truncated series-based preprocessing transfer function.

As will be apparent with reference to FIG. 10 and study of the following material, as a practical matter a truncated series expression using only a few terms of the series need be used for outputs up to about 130 dB. For higher SPL, series terms can be added to create higher order non-linear system transfer functions defining system response to serve as the basis of preprocessing. In another embodiment, a low order series preprocessing transfer function can be combined with another (simpler) function approximating the preprocessing transfer function over the signal magnitude range where neither the truncated Taylor series, nor (on the high end), simple AM yields valid results. In theory it is possible to take the series all the way out to the number of terms required to give valid results (here meaning sufficiently close to actual value) all the way up in SPL until the output is fully in saturation and the series approaches the Merklinger solution (using pure AM).

In practice, solving for the inverse expressions becomes harder and harder as the incremental value of having the additional number of terms in the series becomes less and less compelling. It is well to contemplate the two limiting cases of the Berktay solution at low SPL and Merklinger at high SPL, as well as how to handle the transition between them. Whether it is all the way across with a Taylor Series-based preprocessing transfer function, or such a series for part of the way across, and another polynomial expression of some kind for the last part of the transition where working with the series becomes burdensome, some scheme can be decided upon.

Reasonably low distortion over this range can be obtained using a polynomial, exponential, or some other type or hybrid-type function approximation, rather than the Taylor series. For example, when the burden of solving for the form of equation and calculating the additional terms values becomes large, and the incremental benefit of additional terms becomes small, a different polynomial approximation, or some other approximation makes practical sense. As mentioned this need only be used over part of the range of SPL up until pure AM gives valid results.

The Weakly Nonlinear Solution (Berktay's Solution)

In a very weakly nonlinear parametric array output where $u\ll1$, the array length is limited by the thermoviscous absorption, modeled by the equation:

$$\tan^{-1}[uE(\tau)] \approx uE(\tau). \tag{17}$$

So we recover the Berktay's solution as follows:

$$p_s(r,t) = \frac{\beta S P_0^2}{16\pi\rho_0 c_0^4 \alpha r} \frac{\partial^2}{\partial t^2} E(t-r/c_0)^2 \tag{18}$$

The most evident characteristics of the Berktay's solution are summarized as follows:

(1) The secondary wave is proportional to the second derivative of the envelope function squared;
(2) The amplitude of the secondary wave is proportional to the square of the primary pressure $P_0$;
(3) The amplitude of the secondary wave is inversely proportional to the thermoviscous absorption coefficient $\alpha$, which in turn is dependent of the primary wave frequency $\omega_0$;
(4) For a single secondary tone, there is no distortion with SSB modulation regardless the modulation index, however, there will be distortion with AM modulation.

To validate the condition $u\ll1$, we can apply ultrasound at a pressure level between 120 and 125 dB for the frequency range of 30 kHz to 80 kHz, which would generate a very low audio sound pressure level in general. The parametric emitter sensitivity in an example emitter used to verify this (available from American Technology Corporation, San Diego Calif.) is around 126 dB per 10 V rms input at the resonant frequency where the primary (carrier) frequency signal is placed. With an emitter driven to as high as 50 V rms, which corresponds to the ultrasound level of 130 dB, the ultrasound level index u is between 1 to 2 for the frequency range of 40 kHz to 80 kHz. Thus Berktay's solution is no longer applicable at this SPL. We have passed out of the output level range where the Berktay solution gives valid results and into the transition zone between the two limiting cases.

Saturation Solution (Merklinger's Solution)

In a very strong nonlinear parametric array where $u\gg1$, the array length is limited by the nonlinear absorption (saturation) based on the equation:

$$\tan^{-1}[uE(\tau)] \approx \frac{\pi}{2}\text{sign}E(\tau). \tag{19}$$

We recover the Merklinger's solution as follows:

$$p_s(r,t) = \frac{SP_0}{8\omega_0 rc_0} \frac{\partial^2}{\partial t^2} |E(\tau)|. \tag{20}$$

It should be pointed out that Willette and Moffett (J. G. Willette and M. B. Moffett, "Harmonics of the difference frequency in saturation-limited parametric sources," J. Acoust. Soc. Am., Vol. 62, No. 6, pp. 1377-1381, 1977) derived an equation for the secondary sound pressure in saturation-limited parametric sources. Experimentally, Willette and Moffett and Aoki et al. reported that the secondary wave harmonic distortion decreases while the primary wave pressure increases if an AM modulation schemes is employed. The most evident characteristics of the Merklinger solution are summarized as follows:

(1) The secondary wave is proportional to the second derivative of the absolute of the envelope function;
(2) The amplitude of the secondary wave is proportional to the primary pressure $P_0$;
(3) The amplitude of the secondary wave is inversely proportional to the primary wave frequency $\omega_0$;
(4) The amplitude of the secondary wave is independent of the nonlinearity parameter $\beta$;
(5) For a single secondary tone, there is no distortion with AM modulation if the modulation index is equal to or less than 1, however, there will be distortion with SSB modulation.

Distortion Correction Algorithms

As set forth above, algorithms were developed for distortion correction based on the Berktay's solution Eq(18). We now take up distortion correction algorithms for the general solution Eq(16) and the saturation solution Eq(20).

A. Distortion Correction Algorithms—General Solution

As mentioned earlier, only the first few terms of the mathematical expression are needed to approximate the secondary wave pressure for moderate ultrasound levels. This section is devoted to describing the distortion correction for the solutions with two, three, four and five terms, respectively. The same scheme can be applied when more terms are used, as needed.

B. Two Terms Solution

A two terms solution is expressed as follows:

$$p_s(r,t) = \frac{\beta S P_0^2}{16\pi \rho_0 c_0^4 \alpha r} \frac{\partial^2}{\partial t^2} \left\{ [E(\tau)]^2 - \frac{1}{3} u^2 [E(\tau)]^4 \right\}. \quad (21)$$

Equation (21) shows the secondary wave is proportional to:

$$p_s(r,t) \propto \frac{\partial^2}{\partial t^2} \left( E^2 - \frac{u^2}{3} E^4 \right). \quad (22)$$

As described, a preprocessing scheme for a two terms solution for the audio signal E(t) can be implemented in order to recover the original audio signal. One embodiment of a preprocessing scheme for a two terms solution is illustrated in FIG. 2.

Figure 2:
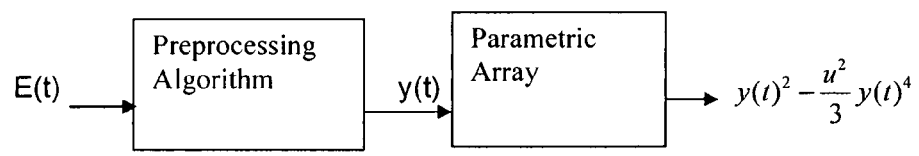
FIG. 2 is a schematic block diagram representation of preprocessing using a two term Taylor series solution of the function defining system response.

Using the scheme illustrated in FIG. 2, we assume the transducer has infinite flat bandwidth for simplicity. In order for the parametric array output to recover the original audio signal, we have:

$$y(t)^2 - \frac{u^2}{3} y(t)^4 = E(t). \quad (23)$$

Solving Equation (23) and applying a Taylor series expansion, we get:

$$y(t)^2 = E(t) + \frac{u^2}{3} E(t)^2 + \frac{2u^4}{9} E(t)^3 + \ldots . \quad (24)$$

Figure 3:
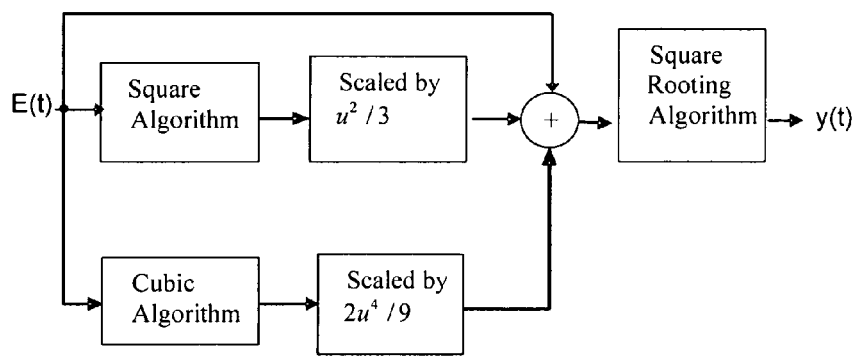
FIG. 3 is a schematic block diagram representation of an audio preprocessing algorithm using a two term Taylor series solution of the function defining system response.

For a 2 terms solution to be valid, $u^2/3 \ll 1$. We can choose the first 3 terms to represent $y(t)^2$, hence the audio preprocessing algorithms for 2 terms solution will be shown in FIG. 3 and given by Equation (25) as follows:

$$y(t) = \left[ E(t) + \frac{u^2}{3} E(t)^2 + \frac{2u^4}{9} E(t)^3 \right]^{1/2}. \quad (25)$$

C. Three Terms Solution

A three terms solution is expressed as follows:

$$p_s(r,t) = \frac{\beta S P_0^2}{16\pi \rho_0 c_0^4 \alpha r} \frac{\partial^2}{\partial t^2} \left\{ [E(\tau)]^2 - \frac{1}{3} u^2 [E(\tau)]^4 + \frac{1}{5} u^4 [E(\tau)]^6 \right\}. \quad (26)$$

Equation (26) shows the secondary wave is proportional to:

$$p_s(r,t) \propto \frac{\partial^2}{\partial t^2} \left( E^2 - \frac{u^2}{3} E^4 + \frac{u^4}{5} E^6 \right). \quad (27)$$

Figure 4:
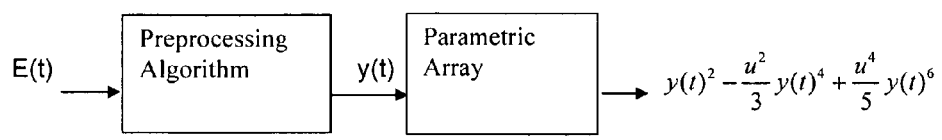
FIG. 4 is a schematic block diagram representation of preprocessing using a three term Taylor series solution of the function defining system response.

A preprocessing scheme for a three terms solution for the audio signal E(t) can be implemented in order to recover the original audio signal, as shown in FIG. 4.

Here again we assume the transducer has infinite flat bandwidth for simplicity. In order for the parametric array output to recover the original audio signal, we have:

$$y(t)^2 - \frac{u^2}{3} y(t)^4 + \frac{u^4}{5} y(t)^6 = E(t). \quad (28)$$

Solving Equation (28), we get:

$$y(t)^2 = E(t) + \frac{u^2}{3} E(t)^2 + \frac{4u^4}{45} E(t)^3 - \frac{14u^6}{135} E(t)^4 + \ldots . \quad (29)$$

Figure 5:
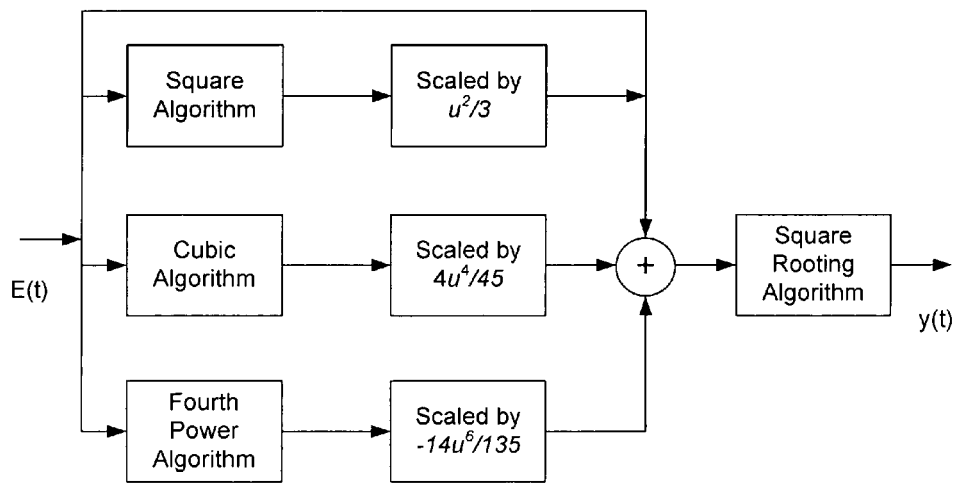
FIG. 5 is a schematic block diagram representation of an audio preprocessing algorithm using a three term Taylor series solution of the function defining system response.

For a three terms solution, we can choose the first four terms to represent $y(t)^2$. Hence, the audio preprocessing algorithms for the three terms solution, as shown in FIG. 5, will be given by Equation (30) as follows:

$$y(t) = \left[ E(t) + \frac{u^2}{3} E(t)^2 + \frac{4u^4}{45} E(t)^3 - \frac{14u^6}{135} E(t)^4 \right]^{1/2}. \quad (30)$$

D. Four Terms Solution

A four terms solution is expressed as follows $$p_s(r, t) = \frac{\beta S P_0^2}{16\pi \rho_0 c_0^4 \alpha r} \frac{\partial^2}{\partial t^2} \left\{ [E(\tau)]^2 - \frac{1}{3}u^2[E(\tau)]^4 + \frac{1}{5}u^4[E(\tau)]^6 - \frac{1}{7}u^6[E(\tau)]^8 \right\}. \tag{31}$$

Equation (31) shows the secondary wave is proportional to:

$$p_s(r, t) \propto \frac{\partial^2}{\partial t^2} \left( E^2 - \frac{u^2}{3}E^4 + \frac{u^4}{5}E^6 - \frac{u^6}{7}E^8 \right). \tag{32}$$

Figure 6:
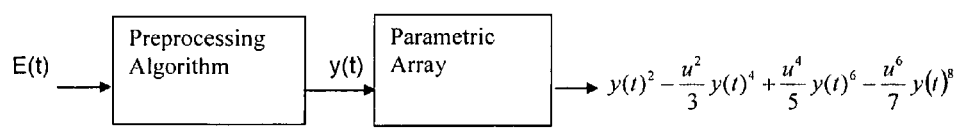
FIG. 6 is a schematic block diagram representation of preprocessing using a four term Taylor series solution of the function defining system response.

Again, a preprocessing scheme for the four terms solution for the audio signal E(t) can be implemented in order to recover the original audio signal, as illustrated in the exemplary embodiment shown in FIG. 6.

We assume the transducer has infinite flat bandwidth for simplicity. In order for the parametric array output to recover the original audio signal, we have:

$$y(t)^2 - \frac{u^2}{3}y(t)^4 + \frac{u^4}{5}y(t)^6 - \frac{u^6}{7}y(t)^8 = E(t) \tag{33}$$

Solving Equation (33), we get:

$$y(t)^2 = E(t) + \frac{u^2}{3}E(t)^2 + \frac{u^4}{45}E(t)^3 - \frac{u^6}{189}E(t)^4 + \frac{1586 u^8}{14175}E(t)^5 + \ldots \ . \tag{34}$$

Figure 7:
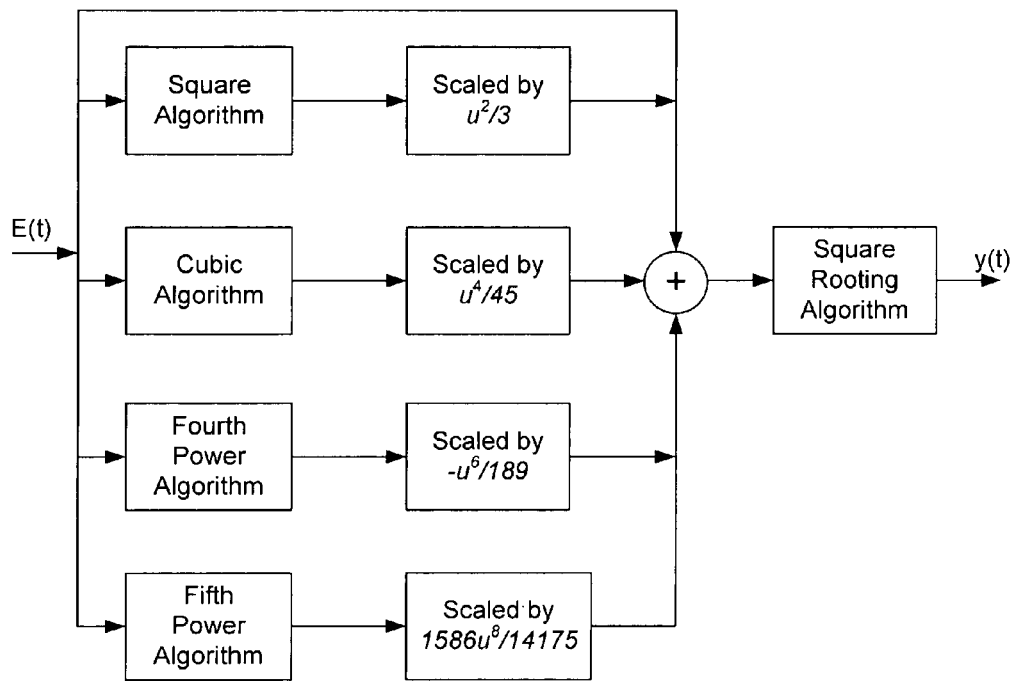
FIG. 7 is a schematic block diagram representation of an audio preprocessing algorithm using a four term Taylor series solution of the function defining system response.

For a four terms solution, we can choose the first five terms to represent $y(t)^2$, hence the audio preprocessing algorithms for the four terms solution, as illustrated in FIG. 7, will be given by Equation (35) as follows:

$$y(t) = \left[ E(t) + \frac{u^2}{3}E(t)^2 + \frac{u^4}{45}E(t)^3 - \frac{u^6}{189}E(t)^4 + \frac{1586 u^8}{14175}E(t)^5 \right]^{1/2} \tag{35}$$

E. Five Terms Solution

A five terms solution is expressed as follows:

$$p_s(r, t) = \frac{\beta S P_0^2}{16\pi \rho_0 c_0^4 \alpha r} \frac{\partial^2}{\partial t^2} \left\{ [E(\tau)]^2 - \frac{1}{3}u^2[E(\tau)]^4 + \frac{1}{5}u^4[E(\tau)]^6 - \frac{1}{7}u^6[E(\tau)]^8 + \frac{1}{9}u^8[E(t)]^{10} \right\}. \tag{36}$$

Equation (36) shows the secondary wave is proportional to:

$$p_s(r, t) \propto \frac{\partial^2}{\partial t^2} \left( E^2 - \frac{u^2}{3}E^4 + \frac{u^4}{5}E^6 - \frac{u^6}{7}E^8 + \frac{u^8}{9}E^{10} \right) \tag{37}$$

Figure 8:
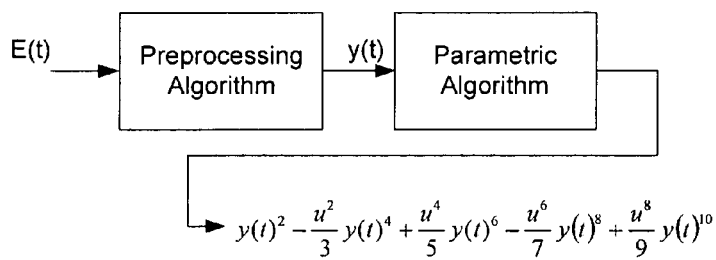
FIG. 8 is a schematic block diagram representation of preprocessing using a five term Taylor series solution of the function defining system response.

Again, a preprocessing scheme for the five terms solution for the audio signal E(t) can be implemented in order to recover the original audio signal, as illustrated in the exemplary embodiment shown in FIG. 8.

Here we assume the transducer has infinite flat bandwidth for simplicity. In order for the parametric array output to completely recover the original audio signal, we have $$y(t)^2 - \frac{u^2}{3}y(t)^4 + \frac{u^4}{5}y(t)^6 - \frac{u^6}{7}y(t)^8 + \frac{u^8}{9}y(t)^{10} = E(t) \tag{38}$$

Solving Equation (38), we get $$y(t)^2 = \tag{39}$$
$$E(t) + \frac{u^2}{3}E(t)^2 + \frac{u^4}{45}E(t)^3 - \frac{u^6}{189}E(t)^4 + \frac{11 u^8}{14175}E(t)^5 + \ldots$$

Figure 9:
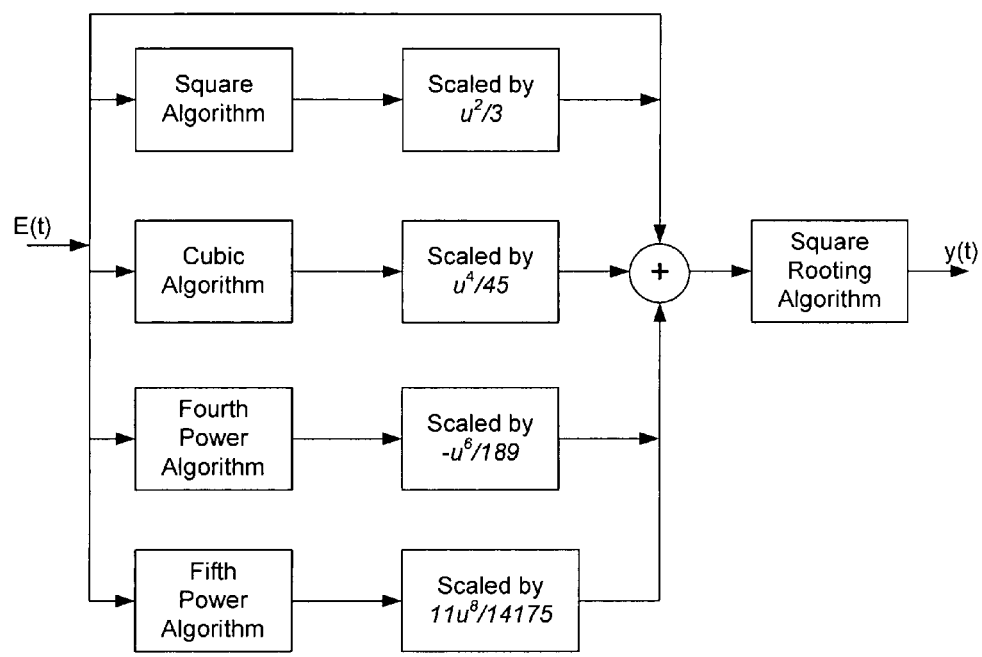
FIG. 9 is a schematic block diagram representation of an audio preprocessing algorithm using a five term Taylor series solution of the function defining system response.

For a five terms solution, as shown in FIG. 9, we can choose the first five terms to represent $y(t)^2$, hence the audio preprocessing algorithms for a five terms solution will be given by Equation (40) as follows:

$$y(t) = \left[ E(t) + \frac{u^2}{3}E(t)^2 + \frac{u^4}{45}E(t)^3 - \frac{u^6}{189}E(t)^4 + \frac{11 u^8}{14175}E(t)^5 \right]^{1/2} \tag{40}$$

While the resulting mathematical expressions for more than the five term solution can be implemented well enough, deriving them can be difficult as mentioned above. That greater difficulty attends higher order series correction expression derivation, as will be more apparent, having reviewed the examples. An expert system may be programmed to derive these terms out to higher orders. But as mentioned above, in practice using another more simple approximation instead of the more accurate but difficult to derive high-order series solution can be an advantageous practical implementation.

Also, in one example of an implementation, a look-up table can be used to avoid calculation in real time. In one example the table can contain "pre-distorted" signal values to be substituted or in another example correction values (scalars or addition/subtraction values) to be applied at each time instant to input signal values. These are tabulated in terms of two arguments, namely input signal value E and ultrasound pressure index value u at each time instant. Since such a "multi-dimensional" table can be large, processing overhead is traded for memory overhead. Also, prerecording material to be reproduced in the system can be done to move the preprocessing to a separate step carried out outside the parametric system. Large look-up tables can be less burdensome in such an implementation.

In any case, reducing the processing overhead can be desirable in implementing the preprocessing scheme in commercial parametric system devices. Another simplified approach will now be discussed.

Modified Two Term Approach

The two term solution can be modified to $$y(t) = \left[ E(t) + \frac{u^2}{3}E(t)^2 \right]^{1/2} \tag{41}$$

by eliminating the cubic term. With reference to FIG. 10, it will be appreciated that while not strictly valid above about 130 dB, modified two term solution for the preprocessing transfer function shown in Equation (41) does nevertheless give results that deviate less sharply from validity than the next few higher order solutions, as shown at line 1002. Moreover, it also gives results that may deviate but then trend back towards accuracy over a range of inputs. The net correction it imparts to an input in a DSB modulated system approaches zero as saturation is approached as would be the case if an infinite number of terms were employed. As such, this simple solution is a special case. Yet it has been found that it improves the overall match of the algorithm results to theory in comparison with somewhat higher order series expressions as mentioned. It is accurate over a smaller range, but nevertheless yields distortion under five percent over the entire range of input/output values. Moreover, the preprocessing transfer function of Equation (41) gives good results over the power level and frequency ranges where distortion is most noticeable and the correction is most needed.

The distortion reduction actually begins to improve above about 140 dB. The transition can be made directly to simple AM without pre-correction, if desired, but the algorithm is so simple to implement that as a practical matter, the savings in processing resources is typically not sufficient to switch over, which is another potential advantage of this modification.

In another example embodiment a higher-order series expression (e.g. the fifth order function 1004 shown in FIG. 10) can be used up until the modified two-term approach 1002 gives better results (about 139 dB in FIG. 10), at which point and above the modified two-term approach can be used. Switching to the more well-behaved two-term solution can be done in combination with using higher order series based preprocessing transfer functions in other embodiments. As will be appreciated the crossover will occur at higher and higher levels as the number of terms used in the preprocessing transfer function goes higher and higher.

Returning to the plot of the modified two term preprocessing transfer function 1002 illustrated in FIG. 10, it has been found that such an expression provides relatively good results (THD under 4%) over the entire range of input values and carrier levels for DSB modulation with distortion correction. As can be appreciated, with modification of the two term expression over the input range that would result in outputs over the say 130-145 dB level range by a further correction (e.g. based on a polynomial expression) the distortion might be kept even lower over the range of input values where it may be improved the most. Note also, that other means to reduce distortion can be used in the SPL region where the modified two term approach gives slightly higher distortion. For example, the modulation index can be lowered as expected error increases, and vice versa, which can also be used to lower distortion.

Distortion Correction Algorithm for the Saturation Solution

In the discussion above it has been mentioned that at sufficiently high SPL (e.g. 160 dB) the Merklinger solution applies; and simple AM can be used without additional preprocessing. As is known from the work of Willette and Moffett, for a single secondary tone, there is no distortion with simple amplitude modulation if the modulation index is 1. We have also found that under certain conditions—including essentially full saturation in the output—AM also works for a single secondary tone and multiple secondary tones if the modulation index is less than 1, as well as 1. Therefore as discussed, in one example when the level is above a selected value (which may be frequency dependant or otherwise vary), in a DSB implementation the calculation burden of the pre-processing transfer function need not be taken on, especially if many terms are implicated. Confirmation of this is set out below.

A. Single Secondary Tone

Figure 11:
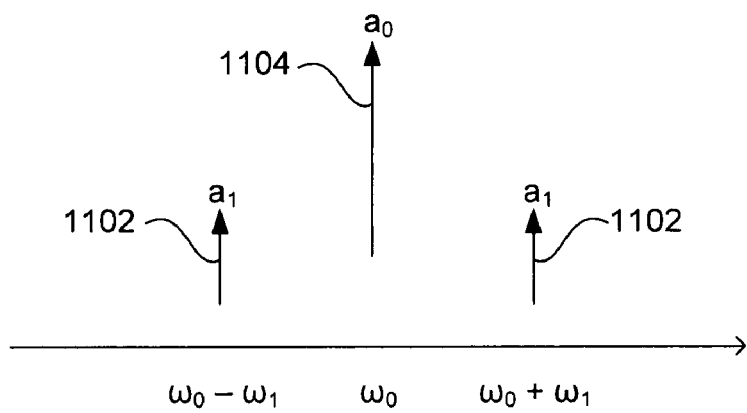
FIG. 11 is a frequency vs. level plot of a single tone DSB parametric output illustrating the primary (carrier) frequency signal and one secondary tone.

FIG. 11 shows a double sideband modulated signal with a secondary tone 1102 with amplitude $a_1$ that is offset from a carrier frequency signal 1104 (having amplitude $a_0$) by a frequency value $\omega_1$.

The ultrasound wave will be given by:

$$a_0 \cos \omega_0 t + a_1 \cos(\omega_0 - \omega_1)t + a_1 \cos(\omega_0 + \omega_1)t = (a_0 + 2a_1 \cos \omega_1 t)\cos \omega_0 t \quad (42)$$

So the envelope function is given by:

$$E(t) = a_0 + 2a_1 \cos \omega_1 t, \quad (43)$$

by choosing the carrier amplitude as:

$$a_0 \geq 2a_1. \quad (44)$$

Since $|\cos \omega t| \leq 1$, we have:

$$|E(t)| = E(t), \quad (45)$$

and the parametric array output will be:

$$p_s \propto \frac{\partial^2}{\partial t^2}|E(t)| = -2a_1 \omega_1^2 \cos \omega_1 t. \quad (46)$$

So under the condition of Equation (46), we completely recover the original audio tones without any distortion. Equation (46) is equivalent to the AM modulation index equal to 1 (full modulation) or less (under-modulation). The only difference is that the non-distorted secondary pressure $p_s$ is maximized when the ultrasound is fully modulated ($a_0 = 2a_1$).

B. Multiple Secondary Tones

Suppose we have multiple audio tones at the frequencies of $\omega_1, \omega_2, \ldots, \omega_i$, which have the amplitude $a_1, a_2, \ldots, a_i$, respectively. In a similar manner, we show that if the carrier amplitude satisfies the following condition:

$$a_0 \geq 2a_1 + 2a_2 + \ldots + 2a_i, \quad (47)$$

then the secondary output will have the form:

$$p_s \propto -2a_1 \omega_1^2 \cos \omega_1 t - 2a_2 \omega_2^2 \cos \omega_2 t + \ldots 2a_i \omega_i^2 \cos \omega_i t \quad (48)$$

Again we can completely recover the audio signal if the AM modulation index is 1 (full modulation) or less (under modulation). The difference is that the non-distorted secondary pressure $p_s$ is maximized when the ultrasound is fully modulated ($a_0 = 2a_1 + 2a_2 + \ldots + 2a_i$). From the discussion of the single tone and the multiple tone cases it will be appreciated that distortion does not occur when both: 1) AM is used; and, 2) the output is in saturation. Under these conditions, a modulation index of less than one represents both an inefficiency (as some output power is not used to create audible output of the secondary audio signal) and a margin of safety. A modulation index of somewhat less than 1 (say between 0.80 to 0.95) can be used to prevent distortion due to inadvertent over-modulation and otherwise provide for the unexpected.

Dynamic Carrier Level

A significant advantage of distortion reduction in parametric arrays as set out above is that it enables increasing the efficiency of the system. A low modulation index has typically been used to keep distortion lower. A low modulation index for keeping distortion low is not needed when the distortion is already low due to the methods discussed above. Hand in hand with this concept is the idea that efficiency of reproduction can be enhanced by varying the primary signal level to match the envelope of the audio signal. In this way only enough carrier as may be needed to provide for the reproduction of the program material is used. The average system output power requirement, heat generated in the emitter, and unneeded ultrasound energy emitted can be greatly reduced. Situations where there is high carrier SPL and low audio SPL, which occur in a constant carrier level system, are minimized to the extent possible.

With a constant carrier, the envelope function is given by:

$$E(t)=1+ma(t), \quad (49)$$

where 1 is for the constant carrier, m is the modulation index, and a(t) is the audio input.

With a dynamic carrier, the envelope function becomes:

$$E(t)=e(t)+ma(t), \quad (50)$$

where e(t) is the audio envelope which determines the carrier amplitude, m is the modulation index, and a(t) is the audio input.

A dynamic carrier can cause an effect on the demodulated audio output level due to the carrier amplitude level. Without preprocessing, the demodulated audio output is given by Equation (9), namely, the output is proportional to:

$$E(t)\tan^{-1}[uE(t)], \quad (51)$$

when the input amplitude is E(t). The output amplitude is not proportional to corresponding input amplitude, therefore, a gain compensation may be required. For example, with a Berktay model, the output is proportional to $$E^2(t) = [e(t) + ma(t)]^2 \quad (52)$$
$$= e^2(t) + 2me(t)a(t) + a^2(t).$$

We see that the fundamental component amplitude of demodulated audio will be 2me(t)a(t), which is not proportional to the audio a(t). It also depends on the carrier level e(t). Therefore, a gain compensation is required. Note that this gain compensation will depend on the carrier level. It can also be seen that the demodulated audio also introduces the second harmonic term $a^2(t)$.

Figure 12:
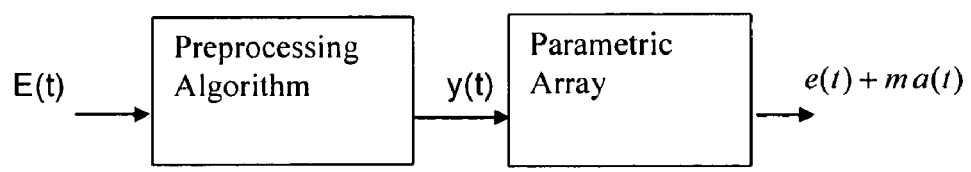
FIG. 12 is a general schematic block diagram of parametric preprocessing and reproduction.

A general block diagram with audio preprocessing and air demodulation is illustrated in FIG. 12. So long as we choose a proper preprocessing, the demodulated audio output will be proportional to $$E(t)=e(t)+ma(t). \quad (53)$$

We see that audio output is always proportional to its input a(t) as long as the modulation index m is kept constant.

In reality a dynamic carrier may not fully track the audio envelop e(t). In other words, a dynamic carrier may be implemented with various attack/release time limitations, which implies the modulation index m may not be kept as a constant during the dynamic carrier processing. Nevertheless, this has been found to be a minor issue generally speaking where the non-linear system transfer function is dependent on the signal envelope (as is the case in the examples given above).

Moreover, in the examples given above the audio preprocessing for distortion correction can be though of as a process to compress or expand (as may be needed, at each time instant) the input audio signal before it is expanded or compressed (as it may be at each time instant) parametrically in the air. Thus even with a dynamic carrier, no gain compensation is needed using a methodology such as that disclosed by example herein. In the examples given above, the u value can be used directly to modulate carrier level. This does include the caveat that rate of change of u is monitored and is limited as needed to prevent over modulation, as just alluded to. Some look-ahead can be used to monitor the input signal envelope through the u value to insure the rise and fall and inflection of the carrier level is within the prescribed rates. Additionally, u value can be monitored to ensure that the peaks of the program material can be met by sufficient primary signal power, and that the system takes as much advantage of the troughs as is possible; all while at the same time limiting the carrier envelope rise and fall rates to those which would give rise to audible artifacts.

The advantages of a dynamic carrier will be apparent. The particular synergy between distortion reduction, as described herein, and using a dynamic carrier is that a much higher modulation index can be maintained. Thus, the power efficiency advantages of using a dynamic carrier are more fully realized. As mentioned, the modulation index changes somewhat as primary signal level changes, but overall a high modulation index can be maintained and carrier (primary signal) power minimized without a distortion penalty. This provides a substantial improvement over prior systems, wherein a low modulation index was considered needful to keep distortion within reasonable limits.

In one example, the system can be configured to depend on a known modulation index, rather than a known primary signal amplitude. The modulation index can be arbitrarily chosen, for example set at 0.85 or 0.90. Moreover, it can be made variable (but again in a known way) according to a selected parameter. For example, it might be reduced as in the modified two term example given, over a specified input level range. Recall from the above discussion that when attack and release rates of carrier change are controlled the modulation index can change within a limited range, and this is found to not be problematic. This is due, at least in part, to the fact that modulation index drops below, rather than rises above, a selected value when this mismatch between carrier envelope and audio envelope occurs. If anything, fidelity improves with this mismatch. Since it represents an inefficiency however, it is not desirable per se. In most cases this is another synergy that can be used as an advantage in an example implementation in a parametric audio reproduction system.

Figure 13:
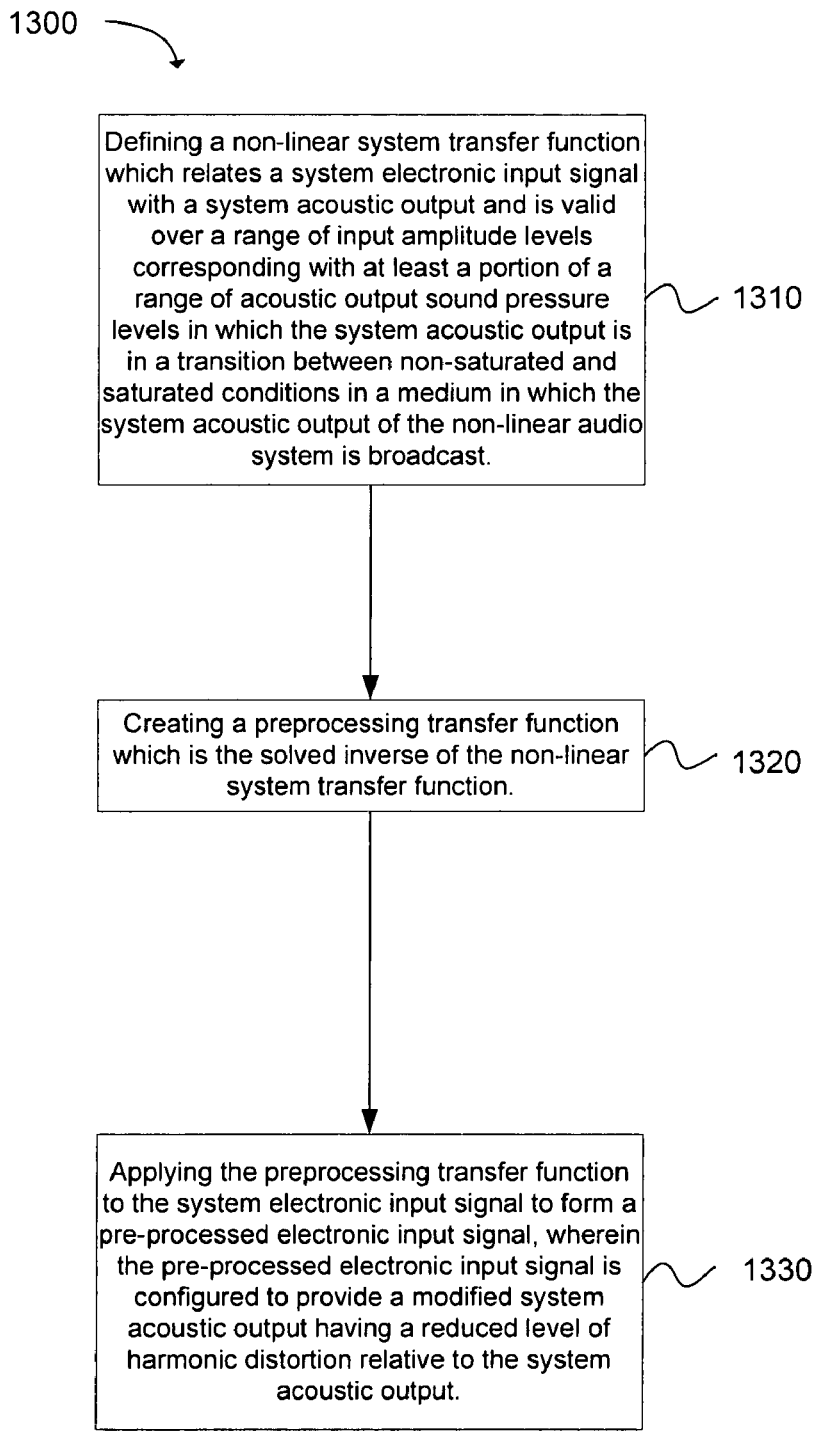
FIG. 13 is a flow chart depicting a method for distortion reduction in a non-linear audio system in accordance with an embodiment of the present invention.
Figure 14:
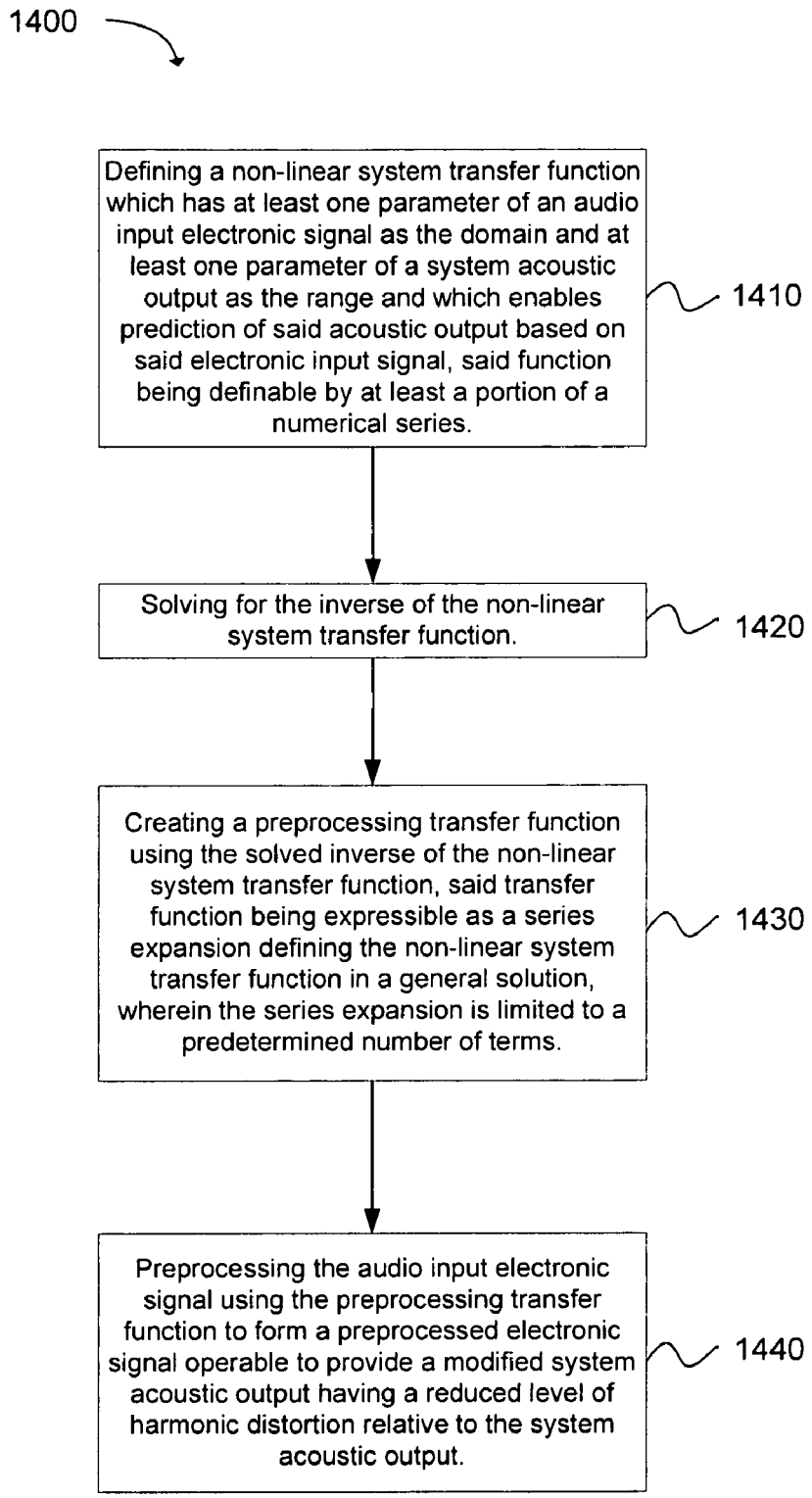
FIG. 14 is a flow chart depicting an additional method for reducing distortion in a non-linear audio system.

In another embodiment, a method 1300 of distortion reduction in a non-linear audio system is disclosed, as illustrated in FIG. 13. The method includes the operation of defining 1310 a non-linear system transfer function which relates a system electronic input signal with a system acoustic output. The non-linear system transfer function is valid over a range of input amplitude levels corresponding with at least a portion of a range of acoustic output sound pressure levels in which the system acoustic output is a transition between non-saturated and saturated conditions in a medium in which the system acoustic output of the non-linear audio system is broadcast. The medium is typically air. However, the system can also be configured to operate in other mediums such as water or a particular type of gas.

The method 1300 further includes the operation of creating 1320 a preprocessing transfer function which is the solved inverse of the non-linear system transfer function. Another operation provides applying 1330 the preprocessing transfer function to the system electronic input signal to form a pre-processed electronic input signal. The pre-processed electronic input signal is configured to provide a modified system acoustic output having a reduced level of harmonic distortion relative to the system acoustic output.

In yet another embodiment, a method 1400 for reducing distortion in a non-linear audio system is disclosed. The method includes the operation of defining 1410 a non-linear system transfer function which has at least one parameter of an audio input electronic signal as the domain and at least one parameter of a system acoustic output as the range. The non-linear system transfer function enables prediction of the acoustic output based on the electronic input signal. The function is definable by at least a portion of a numerical series. For example, numerical series may be a Taylor series.

The method 1400 includes the additional operation of solving 1420 for the inverse of the non-linear system transfer function. An additional operation includes creating 1430 a preprocessing transfer function using the solved inverse of the non-linear system transfer function. The transfer function is expressible as a series expansion defining the non-linear system transfer function in a general solution. The series expansion is limited to a predetermined number of terms. In one embodiment, the series expansion can be a Taylor series. Alternatively, it may be a modified Taylor series wherein one or more of the series components have been removed. For example, a Taylor series of cubic form may be used, with the cubic term removed.

The method 1400 further includes the operation of preprocessing 1440 the audio input electronic signal using the preprocessing transfer function to form a preprocesses electronic signal operable to provide a modified system acoustic output having a reduced level of harmonic distortion relative to the system acoustic output.

As will be appreciated after study of the forgoing, the invention provides a number of advantages and can improve fidelity in audio reproduction. While certain example embodiments have been described, it is not intended that the invention be limited to those examples. Variations and additional features and advantages that would occur to one skilled in the art exercising that skill and the knowledge imputed to one so skilled without exercise of inventive faculty are intended to be included. Accordingly, it is not intended that the invention be limited, except as by the claims set forth below.

What is claimed is:

1. A method of distortion reduction in a non-linear audio system, comprising the steps of:
    defining a non-linear system transfer function which relates a system electronic input signal with a system acoustic output and is valid over a range of input amplitude levels corresponding with at least a portion of a range of acoustic output sound pressure levels in which the system acoustic output is in a transition between non-saturated and saturated conditions in a medium in which the system acoustic output of the non-linear audio system is broadcast;
    creating a preprocessing transfer function which is the solved inverse of the non-linear system transfer function; and
    applying the preprocessing transfer function to the system electronic input signal to form a pre-processed electronic input signal, wherein the pre-processed electronic input signal is configured to provide a modified system acoustic output having a reduced level of harmonic distortion relative to the system acoustic output;
    wherein the preprocessing transfer function is of the form:

$$y(t) = \left[E(t) + \frac{u^2}{3}E(t)^2\right]^{1/2}$$

wherein y(t) is the preprocessed electronic audio signal, E(t) is the input electronic audio signal, and u is an ultrasound pressure index value.

2. A method as in claim 1, wherein applying the preprocessing transfer function to the system electronic input signal further comprises altering the system electronic input signal using at least one of the operations selected from the group consisting of multiplying the input signal by a scalar value at each time instant and adding a scalar value to the input signal at each time instant.

3. A method as in claim 1, further comprising modulating a first ultrasonic signal having a first frequency with a second ultrasonic signal having a second frequency to form the system electronic input signal.

4. A method as in claim 1, further comprising modulating the first and second ultrasonic signals using dual sideband modulation when the system electronic audio signal has an amplitude less than a predetermined value and amplitude modulation when the system electronic audio signal has an amplitude greater than the predetermined value.

5. A signal preprocessor system for reducing distortion of an input audio signal in the output of a non-linear audio system, including:
    an input line configured to receive an input electronic audio signal;
    an output line configured to output a preprocessed electronic audio signal to the non-linear audio system;
    a processor disposed between and connected to the input line and output line, and programmed to implement a preprocessing transfer function that is the solved inverse of a non-linear system transfer function defining distortion of the input electronic audio signal in an output acoustic of the system, enabling reduced harmonic distortion in the output acoustic of the non-linear audio system; wherein:
    the preprocessing transfer function is of the form:

$$y(t) = \left[E(t) + \frac{u^2}{3}E(t)^2\right]^{1/2}$$

wherein y(t) is the preprocessed electronic audio signal, E(t) is the input electronic audio signal, and u is an ultrasound pressure index value.

6. A system as in claim 5, wherein the output acoustic of the non-linear audio system is a parametric acoustic signal comprising two ultrasonic acoustic signals operable to demodulate in air and form a difference acoustic signal.

7. A system as in claim 5, wherein the input electronic audio signal is comprised of a first ultrasonic audio signal modulated with a second ultrasonic audio signal.

8. A system as in claim 7, wherein the first and second ultrasonic audio signals are modulated using dual sideband modulation when the input electronic audio signal has an amplitude less than a predetermined value and amplitude modulation when the input electronic audio signal has an amplitude greater than the predetermined value.

* * * * *